United States Patent
Abadi et al.

(10) Patent No.: US 6,552,591 B1
(45) Date of Patent: Apr. 22, 2003

(54) METHOD AND APPARATUS FOR PROCESSING A WIDE DYNAMIC RANGE SIGNAL

(75) Inventors: Kamran Khorram Abadi, Menlo Park, CA (US); James T. Walker, Palo Alto, CA (US); Robert Gustav Lorenz, Menlo Park, CA (US)

(73) Assignee: PiRadian, Inc., Menlo Park, CA (US)

( * ) Notice: Subject to any disclaimer, the term of this patent is extended or adjusted under 35 U.S.C. 154(b) by 0 days.

(21) Appl. No.: 10/002,902

(22) Filed: Nov. 1, 2001

(51) Int. Cl.[7] .................................................. H04B 1/16
(52) U.S. Cl. ....................... 327/306; 327/331; 327/350; 327/553; 330/278; 333/14
(58) Field of Search ................................ 327/552, 350, 327/306, 331, 332, 553; 330/279, 278, 284; 333/14, 16; 455/72

(56) References Cited

U.S. PATENT DOCUMENTS

| | | | |
|---|---|---|---|
| 4,551,688 A | 11/1985 | Craiglow | 330/280 |
| 4,944,024 A * | 7/1990 | Leveque | 455/35 |
| 5,014,013 A | 5/1991 | Kotzian | |
| 5,283,536 A | 2/1994 | Wheatley, III et al. | 330/279 |
| 5,408,697 A | 4/1995 | Price et al. | 455/239.1 |
| 5,572,166 A | 11/1996 | Gilbert | 330/254 |
| 5,627,857 A | 5/1997 | Wilson | 455/345 |
| 5,838,194 A | 11/1998 | Khoury | 330/279 |

* cited by examiner

Primary Examiner—Dinh T. Le
(74) Attorney, Agent, or Firm—Townsend and Townsend and Crew LLP; Kenneth R. Allen

(57) ABSTRACT

Method and apparatus are provided for processing a wide dynamic range analog signal which comprises a compressive nonlinear transfer function responsive to the average amplitude of the signal without feedback along the signal path. The invention employs frequency selective filtering and expansion of the compressed signal. The invention is applicable to any analog signal system having a plurality of channels carrying related signal information.

26 Claims, 5 Drawing Sheets

METHOD AND APPARATUS FOR PROCESSING A WIDE DYNAMIC RANGE SIGNAL

BACKGROUND OF THE INVENTION

This invention relates to processing single channel or single-ended analog signals in a manner which accommodates a wide dynamic range of signal amplitude.

Radio and other wireless receivers must accommodate a wide range of signal levels. This wide dynamic range involves many factors such as path loss and variation in receiver gain. Automatic gain control (AGC) circuits have conventionally been employed for automatically controlling the gain of the receiver to narrow the dynamic range within the receiver. Typically, these gain control circuits have employed feedback circuitry to adapt the gain. Input signal level changes typically cause gain changes in these feedback loops, which require time to damp out, since each current output value is affected by the preceding values. Hence, the feedback loop introduces delay in the response which causes a transient in the desired output.

Logarithmic amplifiers have been used extensively in processing signals with wide dynamic range. Logarithmic amplifiers that are well known are described in detail in two books by Richard Smith Hughes Logarithmic Amplification and Logarithmic Video Amplifiers, cited here for general background in the field. A true logarithmic amplifier accurately reflects at its output the logarithm of the input signal, including sign, over the useful range of the amplifier. This is not to be confused with amplifiers which provide as output the logarithm of the envelope of the input signal.

In U.S. Pat. No. 4,551,688, entitled "DELAY COMPENSATED AUTOMATIC GAIN CONTROL" in the name of Craiglow, FIGS. 2 and 3 show prior art implementations of feedback-based AGC circuits. U.S. Pat. No. 5,283,536, in the name of Wheatley et al., incorporates feedback to implement the same function.

A circuit used as automatic gain control is described in U.S. Pat. No. 5,014,013, entitled "ANTILOG CIRCUIT WITH AUTOMATIC GAIN CONTROL" in the name of Kotzian et al. In this patent, the circuit described uses feedback circuitry utilizing a bipolar transistor to linearize and normalize the amplitude modulation on a high frequency carrier.

A gain controlled amplifier with temperature compensation circuit used in automatic gain controlled circuits with feedback is described in U.S. Pat. No. 5,408,697, entitled "TEMPERATURE-COMPENSATED GAIN-CONTROLLED AMPLIFIER HAVING A WIDE DYNAMIC RANGE" in the name of Price et al. Another circuit with "linear in dB" gain controlled characteristics is described in U.S. Pat. No. 5,572,166 entitled "LINEAR IN DB VARIABLE GAIN AMPLIFIER" in the name of Gilbert.

In U.S. Pat. No. 5,627,857 entitled "LINEARIZED DIGITAL AUTOMATIC GAIN CONTROL" in the name of Wilson describes a digital implementation of an automatic gain control circuit with feedback. U.S. Pat. No. 5,838,194, entitled "CONSTANT SETTLING TIME AUTOMATIC GAIN CONTROL CIRCUITS" in the name of Khoury, describes a similar feedback-type circuit with constant response for all amplitude levels.

What is needed are techniques for extracting modulation characteristics from a signal without undesirable performance characteristics of feedback-based AGC circuits.

SUMMARY OF THE INVENTION

According to the invention, method and apparatus are provided for processing a signal without using feedback along the signal path. The input is typically a single-channel or single-ended wide dynamic range analog signal wherein processing makes use of a dynamic range compressor stage and subsequent operations on the compressed signal. Typically, the compressor stage makes use of a polarity sensitive, compressive nonlinear transfer function, typically implemented with a true logarithmic amplifier, namely an amplifier whose magnitude response to the input signal is substantially logarithmic and which is additionally sensitive to the sign of the input. This type of amplifier is effective for bipolar signals. According to the invention, a characteristic related to the average amplitude level of the compressed signal is detected and is used to produce an output signal whose amplitude is nominally equal to a chosen value. A frequency selective filter is employed to select the frequencies used in this averaging and which will not appear at the output; that is, allowing modulation characteristics to pass while setting the nominal value of the output signal to a desired level, even in the presence of signals with non-constant envelope. The characteristics of this filter are optionally controllable by means of a response control input rather than feedback. This controllability is desirable in accommodating signals with differing modulation characteristics. The characteristics of the frequency selective filter are used as a control input to a polarity sensitive exponentiation circuit.

In one embodiment, the polarity sensitive exponentiation circuit is implemented using an emitter-coupled transistor pair that implicitly detects and averages the amplitude of the compressed input signal. The exponentiating transistor pair also serves as the amplitude detector.

In a second embodiment, a separate signal path is used to determine the amplitude of the compressed signal. A synchronous or full-wave detector is employed to determine the amplitude of the compressed signal. One method of implementing a synchronous detector is to multiply the signal by its sign. The sign of the compressed signal may be produced by a hard-limiter. The output of the synchronous detector is applied to the frequency selective filter that may have controllable filter characteristics. To compensate for the group delay introduced by the filtering operation, a delay element may be inserted in the compressed signal path to the exponentiator. The amount of delay may nominally be chosen to equal the group delay introduced by the filtering operation. The output of the filter is used as an additional input to the exponentiation process, the first input being the output of the delay element. The nominal output level of the exponentiation circuit may be adjusted by means of an amplitude control input and a summer placed between the filter and the exponentiation block. The exponentiation process may be implemented as the difference between two exponential responses that produces an arc sine hyperbolic response. This is seen to be an accurate approximation to the polarity sensitive exponentiator.

In a third embodiment, a synchronous detector is used together with an emitter-coupled transistor exponentiation circuit, representing a specific implementation of the second embodiment.

In a fourth embodiment, a polarity-sensitive exponentiator is used. This requires that the subtraction of the average amplitude be done in a more complex manner. Specifically, the output of the frequency selective filter, as modified by the amplitude control, is modulated onto a square wave. The result of this modulation step is subtracted from the compressed signal, optionally delayed by a delay element, and applied to a polarity sensitive exponentiator.

The present invention is highlighted by the use of a true logarithmic amplifier in conjunction with filtering and exponentiation circuits to extract modulation characteristics from a signal without undesirable performance characteristics of feedback-based AGC circuits. In particular, several novel circuit topologies are disclosed which are useful to illustrate various aspects of the present invention.

This invention represents a further development in the field of wide dynamic range amplifiers of the present inventors, as represented by co-pending patent application Ser. No. 09/715,395 entitled METHOD AND APPARATUS FOR PROCESSING A MULTIPLE-COMPONENT WIDE DYNAMIC RANGE SIGNAL filed Nov. 16, 2000, the content of which is incorporated herein by reference.

The invention will be better understood by reference to the following detailed description in connection with the accompanying drawings.

DESCRIPTION OF SPECIFIC EMBODIMENTS

The following description of the invention focuses on an embodiment employing a single channel of analog information containing phase and amplitude information. Each of the embodiments described is interchangeable and is useful in and other signal processing applications. It is to be further understood that the analog basis of the signal information may be processed in a digital domain, so long as the signal processing functions are preserved.

Figure 1:
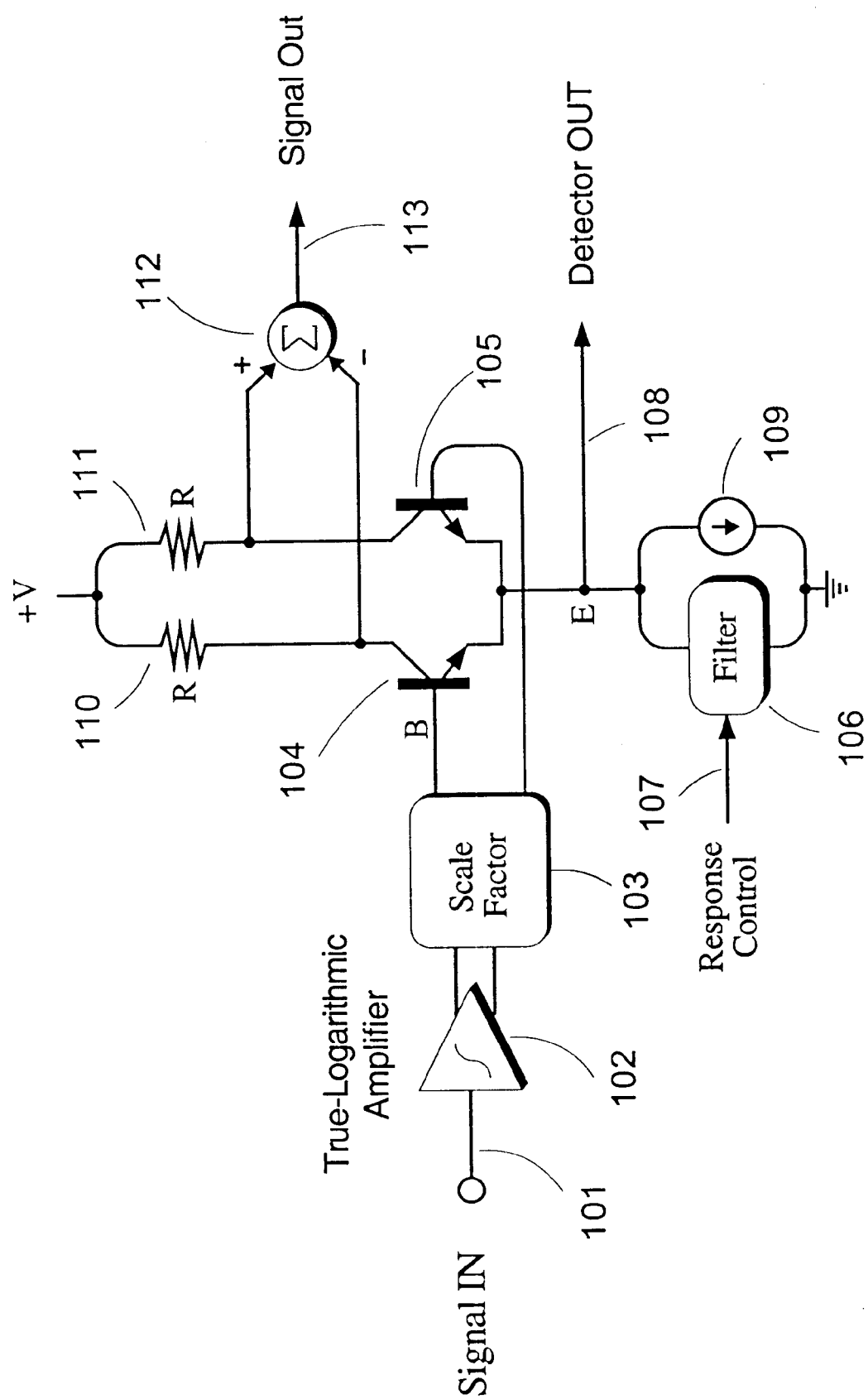
FIG. 1 is a block diagram of a first embodiment of the invention.

Referring to FIG. 1, a system 100 includes a signal input port 101 which provides input data to a true logarithmic amplifier 102. A true logarithmic amplifier has an output polarity dependent on the input polarity and an output magnitude that reflects an approximation to the logarithm of the absolute value of the input signal, viz.

$$v_{out}=k_1\text{sign}(v_m)\log(1+k_2|v_{in}|), \quad (1)$$

where $k_1$ and $k_2$ are constants related to the amplitudes of the output and input respectively. Another approximate mathematical description is given by the arc hyperbolic sine of the input, i.e., $$v_{out}=k_1\sin\,h^{-1}(k_2v_{in}). \quad (2)$$

More generally, the role of the true logarithmic amplifier is used to compress the dynamic range of the input signal; that is, to act as a dynamic range compressor. The significant characteristic of a dynamic range compressor is that the incremental gain is a decreasing function of signal input amplitude.

In this application, it may be desirable to have the output of the true-logarithmic amplifier appear as a differential signal on two connections. The differential signal is symmetric about a common reference voltage. The output of the true-logarithmic amplifier 102 is scaled by scale factor 103, which corresponds to $k_1$ in equation 1. After scaling, the signal is applied to the two base terminals of a bipolar transistor differential pair comprising transistors 104 and 105. The common emitter connection connects to a two terminal filter element 106 and a current source 109. The effect of applying voltage to the emitter-base junction of a bipolar transistor is to produce an exponentially related current in the collector of the transistor. The collectors of 104 and 105 are connected through a pair of load resistors 110 and 111 respectively to a voltage source. The output signal appears in complementary polarities as the collector voltages of 104 and 105. Signal subtractor 112 produces the signal output 113, which corresponds to the difference of these collector voltages.

Figure 2:
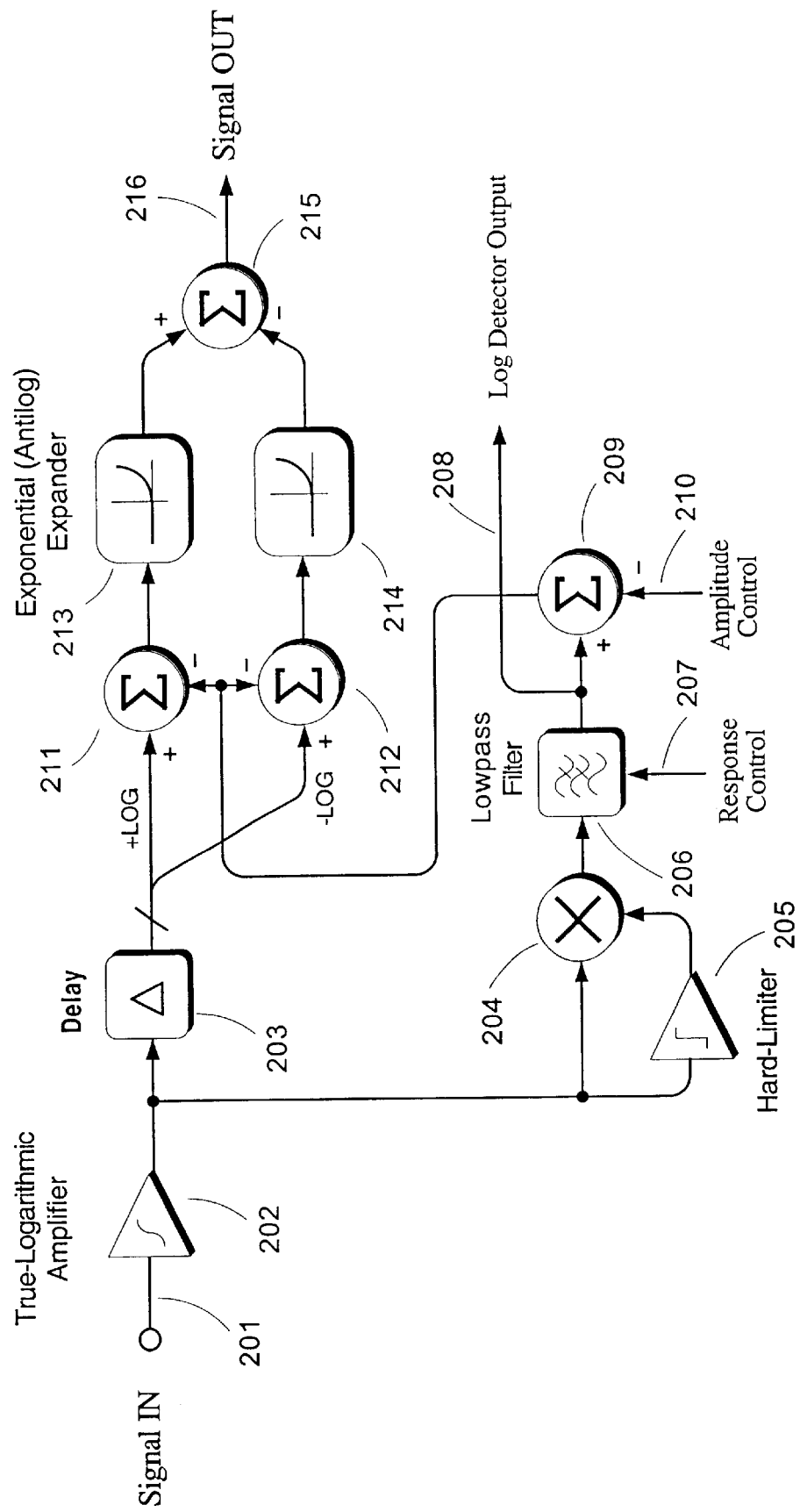
FIG. 2 is a block diagram of a second embodiment of the invention.

Referring now to FIG. 2, system 200 includes a signal input port 201 which provides input data to a true logarithmic amplifier 202. The output of the true-logarithmic amplifier 202 (in this case a single ended output as a matter of design choice) is connected to delay element 203, multiplier 204, and hard limiter 205. The purpose of delay element 203 is to compensate for the group delay in the signal path through filter 206. The collective effect of 204 and 205 is to synchronously demodulate the amplitude of the output of true-logarithmic amplifier 202. The output of multiplier 204 is applied to a frequency selective filter according to the invention, in this case a low-pass filter 206. The properties of this low-pass filter, in particular the cut-off frequency, may be controlled by response control input 207. One such filter is implemented by using a voltage-controlled resistance in conjunction with a fixed capacitance to achieve a voltage variable low-pass filter. The output of low-pass filter 206 appears as the log detector output 208, which approximately corresponds, to the average of the logarithm of the input signal amplitude. The output of low-pass filter 206 is offset, by subtractor 209, using amplitude control input 210. The purpose of input 210 is to set the nominal output signal amplitude to a desired level. The output of subtractor 209 is applied to subtractors 211 and 212. The output of delay element 203 is additionally applied, with opposite signs, to subtractors 211 and 212. It should be appreciated that these signals are differential in nature and the negative of the output of delay element 203 is generally present. The outputs of subtractors 211 and 212 are applied to exponentiation circuits 213 and 214. These exponentiation circuits have an approximately exponential transfer function serving to provide an exponential expansion. The outputs of exponentiation circuits 213 and 214 are subtracted from one another by subtractor 215 to produce the amplitude controlled signal output 216. It should be appreciated that subtractor 209 may be combined with subtractors 211 and 212. Similarly, subtractor 209 may precede low-pass filter 206.

Figure 3:
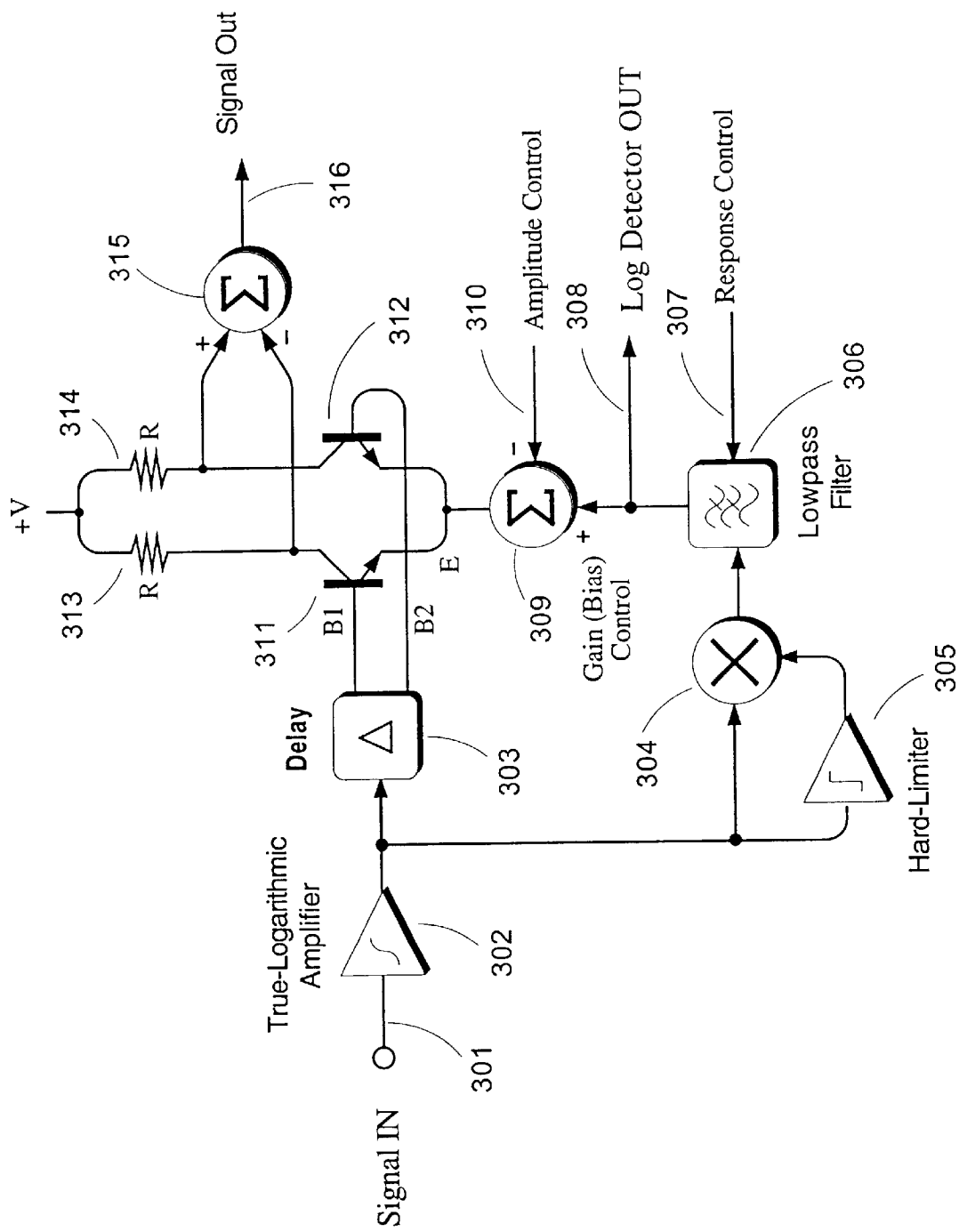
FIG. 3 is a block diagram of a third embodiment of the invention.

Referring now to FIG. 3, system 300 includes a signal input port 301 which provides input to a true logarithmic amplifier 302. The output of the true-logarithmic amplifier 302 is connected to delay element 303, multiplier 304, and hard limiter 305. The purpose of delay element 303 is to compensate for the group delay in the signal path through filter 306. The effect of multiplier 304 and hard limiter 305, taken together, is to synchronously demodulate the amplitude of the output of true logarithmic amplifier 302. The output of multiplier 304 is applied, according to the invention, to a frequency selective filter, in this case low-pass filter 306. As with filter 206 in FIG. 2, the properties of filter 306, in particular the cut-off frequency, may be controlled by response control input 307. One such filter is implemented by using a voltage-controlled resistance in conjunction with a fixed capacitance to achieve a voltage variable low-pass filter. The output of filter 306 appears as the log detector output 308, which approximately corresponds to the average of the logarithm of the input signal amplitude. The output of filter 306 is offset by subtractor 309 using amplitude control input 310. The output of subtractor 309 is applied to the emitters of bipolar transistors 311 and 312. The purpose of control input 310 is to set the nominal output signal amplitude to a desired level. The bases of transistors 311 and 312 are driven by a differential signal that corresponds to the output of the true logarithmic amplifier 302 with a delay introduced by delay element 303.

The effect of applying a voltage across a bipolar transistor junction is to produce an exponentially related current in the collector of the transistor. The collectors of transistors 311 and 312 are connected through a pair of load resistors 313 and 314 respectively to a voltage source. The output signal appears as the difference of the collector voltages. The collector voltages of transistors 311 and 312 are subtracted from one another by subtractor 315 to produce the amplitude-controlled signal output 316. It should be appreciated that subtraction performed by subtractor 309 may be effected by other circuit arrangements. For example, subtractor 309 may precede low-pass filter 306.

Figure 4:
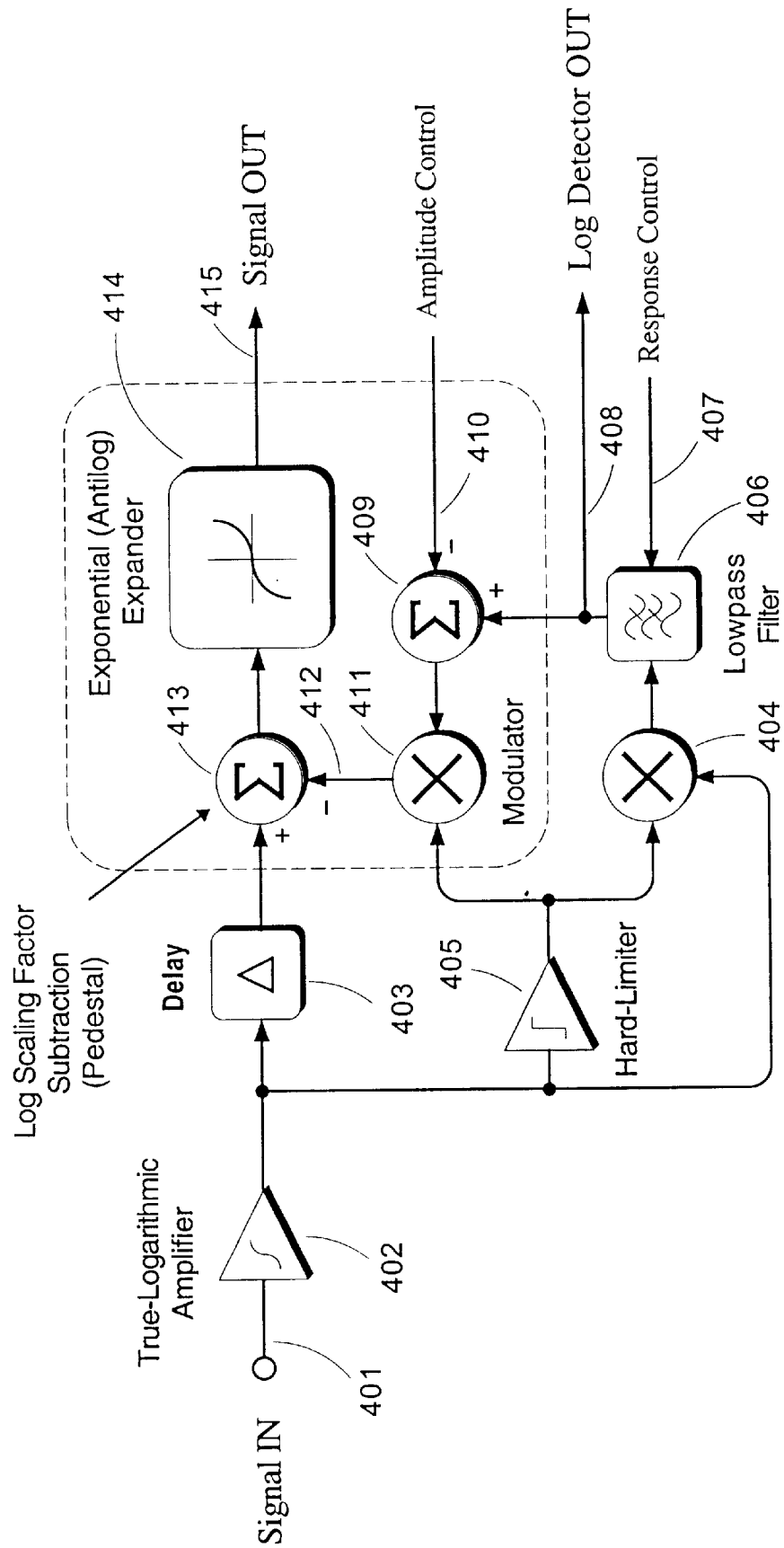
FIG. 4 is a block diagram of a fourth embodiment of the invention.

Referring now to FIG. 4, System 400 includes an input port 401 which provides input to the true logarithmic amplifier 402. The output of the true-logarithmic amplifier 402 is connected to a delay element 403, multiplier 404 and hard limiter 405. The purpose of delay element 403 is to compensate for the group delay in the signal path through filter 406. The effect of 404 and 405 taken together is to synchronously demodulate the amplitude of the output of 402. The output of multiplier 404 is applied to low-pass filter 406. The properties of filter 406, in particular the cut-off frequency, may be controlled by response control input 407 as previously disclosed. The output of low-pass filter 406 appears as the log detector output 408, which approximately corresponds to the average of the logarithm of the input signal amplitude. The output of 406 is offset by subtractor 409, using amplitude control input 410, and applied to a second multiplier 411. The purpose of input 410 is to set the nominal output signal amplitude to a desired level. Multiplier 411 is additionally responsive to the output of hard limiter 405, which gives the polarity of the input signal. The output of multiplier 411 on line 412 approximates a square wave signal under steady state conditions at the signal frequency whose amplitude corresponds to the average of the logarithm of the input signal amplitude. Signals on line 412 are subtracted from the output of the true logarithmic amplifier 402 by subtractor 413, with a delay introduced by delay element 403. The result of this subtraction is applied to exponential expander 414. The operation of expander 414 is analogous to that of the emitter-coupled pair comprising transistors 311 and 312 and of subtractor 315 in FIG. 3. The output of expander 414 is applied to line 415, the signal output port.

METHOD OF PROCESSING

Figure 5:
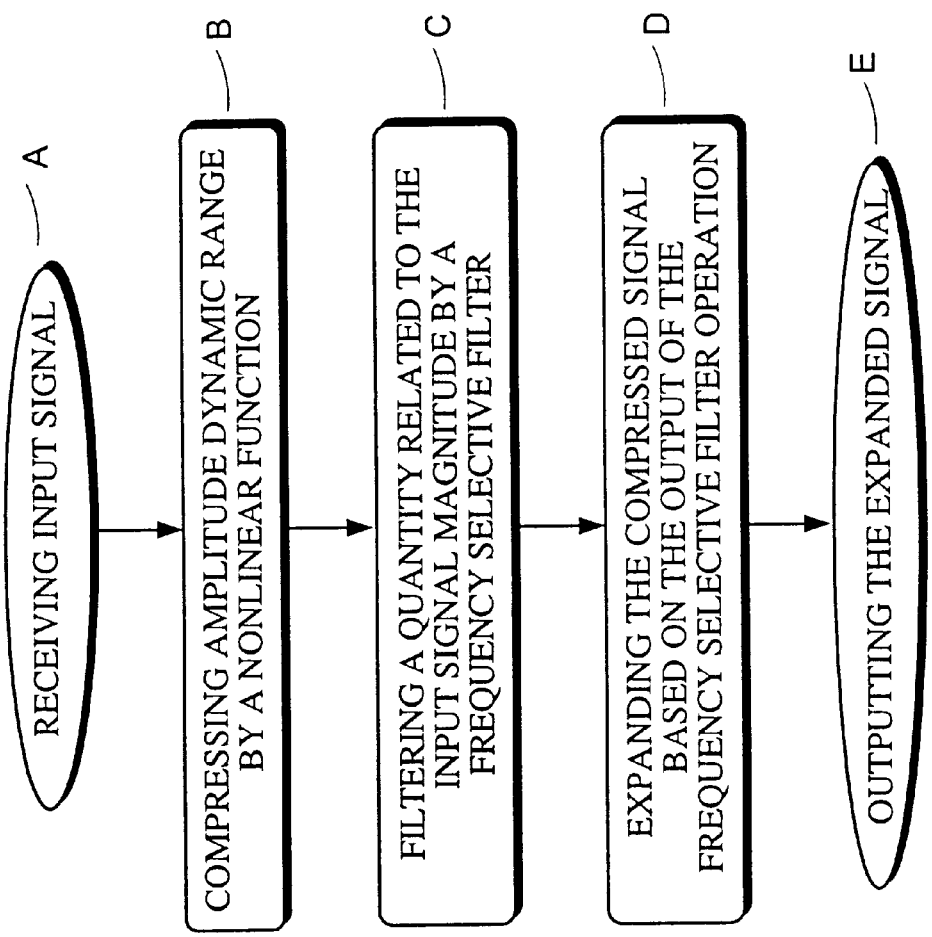
FIG. 5 is a flow chart of a function according to the invention.

The steps of the general method of processing a signal with amplitude and phase information are described below with reference to FIG. 5. The apparatus required for carrying out the above method of processing is disclosed in FIG. 1 through FIG. 4 and in the related detailed descriptions. The steps are as follows:

Receiving the input signals (Step A):

Compressing the amplitude dynamic range of the signal according to a compressive nonlinear transfer function, whose sign is responsive to the sign of the input signal and whose incremental gain is a decreasing function of signal amplitude (Step B);

Filtering using a frequency-selective filtering operation to determine the average value of the compressed input signal (Step C);

Expanding the compressed dynamic range signal using a component that is responsive to the frequency selective filtering operation, that makes use of a nominally exponential transfer characteristic (Step D);

Outputting the expanded signal (Step E).

During the expanding step, the expanding exponentiation provides the polarity sensitive antilogarithm of the logarithmically compressed signal. In this antilog or exponential embodiment of the method, the compressive transfer function and the expanding exponentiation have the same base. However in a non-antilog embodiment, the compressive transfer function and the expanding exponentiation may not have the same base.

Frequency selective filtering of the expanded signal may be done after the expanding step in order to reduce energy in the signal at selected frequencies. This filtering step may be low-pass filtering.

CONCLUSION

Various changes may be made in the structure and embodiments shown herein without departing from the concept of the invention. Further, features of the embodiments shown in the various figures may be employed with the embodiments shown in the other figures. Therefore, the scope of the invention is to be determined by the terminology of the following claims and the legal equivalents thereof.

What is claim is:

1. An apparatus for processing an analog input signal, said analog input signal being subject to variations in amplitude, said apparatus comprising:

a dynamic range compressor circuit with a circuit input and a circuit output coupled to receive said analog input signal for compressing the amplitude dynamic range of said analog input signal to obtain a compressed internal signal corresponding to said analog input signal at said circuit output;

a detection circuit coupled to said circuit output of said dynamic range compressor circuit to produce a detected signal corresponding to amplitude of said compressed internal signal;

a frequency-selective filtering means for filtering said detected signal to obtain an averaged control signal for a signal processing element; and a signal processing element responsive to said averaged control signal and operative on said circuit output of said dynamic range compressor circuit to expand the compressed internal signal to obtain an output signal representative of said analog input signal.

2. The apparatus of claim 1, wherein a characteristic of the frequency selective filtering is variable.

3. The apparatus of claim 2, wherein the variable characteristic is bandwidth.

4. The apparatus of claim 1, wherein the signal processing element uses a transistor pair to expand said compressed internal signal.

5. The apparatus of claim 1, where in the signal processing element uses an emitter-coupled bipolar transistor pair to expand said compressed internal signal.

6. The apparatus of claim 1, wherein the signal processing element uses a source-coupled field effect transistor pair to expand said compressed internal signal.

7. The apparatus of claim 1, wherein the signal processing element uses an expander whose characteristic is substantially hyperbolic sinusoidal to expand said compressed internal signal.

8. The apparatus of claim 1, wherein the dynamic range compressor circuit has a substantially logarithmic transfer function with a polarity sensitive output.

9. The apparatus of claim 1, wherein the dynamic range compressor circuit has a substantially inverse hyperbolic sine transfer function.

10. An apparatus for processing an analog input signal, said analog input signal being subject to variations in amplitude, said apparatus comprising:

a dynamic range compressor circuit with a circuit input and a circuit output coupled to receive said analog input signal for compressing the amplitude dynamic range of said analog input signal at said circuit output;

means for synchronous demodulation of said circuit output of said dynamic range compressor;

a frequency-selective filtering means for filtering output of said synchronous demodulation means;

a signal processing element responsive to output of said filtering means and operative on said circuit output of said dynamic range compressor circuit to expand the compressed internal signal to obtain an output signal representative of said analog input signal.

11. The apparatus of claim 10, wherein a characteristic of the frequency selective filtering is variable.

12. The apparatus of claim 11, wherein the variable characteristic is the bandwidth.

13. The apparatus of claim 10, further including a delay element, wherein said delay element is operative to compensate for delay in the filter.

14. The apparatus of claim 10, wherein the signal processing element has an exponential transfer function.

15. The apparatus of claim 10, wherein the signal processing element uses the difference of two substantially exponential transfer functions to expand said compressed internal signal.

16. The apparatus of claim 10, wherein the signal processing element uses a transistor pair.

17. The apparatus of claim 10, wherein the signal processing element uses an emitter-coupled bipolar transistor pair to expand said compressed internal signal.

18. The apparatus of claim 10, wherein the signal processing element uses a source-coupled field effect transistor pair to expand said compressed internal signal.

19. The apparatus of claim 10, wherein the signal processing element uses an expander whose characteristic is substantially a hyperbolic sinusoid to expand said compressed internal signal.

20. The apparatus of claim 10, wherein output of said filtering means is added to a preselected offset voltage used for setting a desired output signal amplitude of said signal processing element multiplied by the sign of the analog input signal, subtracted from said circuit output of said dynamic range compressor, and applied to said signal processing element.

21. The apparatus of claim 10, wherein the dynamic range compressor circuit has a substantially logarithmic transfer function with a polarity sensitive output.

22. The apparatus of claim 10, wherein the dynamic range compressor circuit has a substantially inverse hyperbolic sine transfer function.

23. The apparatus of claim 10, wherein the signal processing element includes means for dynamically adjusting amplitude of the signal output.

24. A method for processing analog input signals comprising:

receiving said analog input signal;

compressing the amplitude dynamic range of the analog input signal according to a nonlinear transfer function to obtain a compressed internal signal;

filtering a quantity related to magnitude of the analog input signal according to frequency selective criteria to obtain a control signal;

expanding the compressed internal signal according to the control signal to obtain a constant amplitude output signal; and outputting the constant amplitude output signal, wherein the output signal is not subjected to feedback along its signal path from input.

25. The method of claim 24, wherein the compressing step has a substantially logarithmic transfer function with a polarity sensitive output.

26. The method of claim 24, wherein the compressing step has a substantially inverse hyperbolic sine transfer function.

* * * * *